(12) United States Patent
Patriche et al.

(10) Patent No.: US 6,499,609 B2
(45) Date of Patent: Dec. 31, 2002

(54) COMPACT SHELF UNIT FOR ELECTRONIC EQUIPMENT RACK

(75) Inventors: Dorinel Patriche, Chateauguay; Emmanuel Stathopoulos; Daniel Tassé, both of Montreal, all of (CA)

(73) Assignee: Hyperchip Inc., Montreal (CA)

( * ) Notice: Subject to any disclaimer, the term of this patent is extended or adjusted under 35 U.S.C. 154(b) by 50 days.

(21) Appl. No.: 09/871,959

(22) Filed: Jun. 4, 2001

(65) Prior Publication Data

US 2002/0179547 A1 Dec. 5, 2002

(51) Int. Cl.⁷ .............................. A47F 5/00; H05K 7/20
(52) U.S. Cl. .................... 211/175; 312/350; 312/223.2; 361/683; 361/695
(58) Field of Search .................... 211/26, 175, 151; 312/350, 265.1, 265.2, 265.3, 265.4, 265.5, 265.6, 223.2; 361/683, 695

(56) References Cited

U.S. PATENT DOCUMENTS

| | | | | |
|---|---|---|---|---|
| 3,356,432 A | * | 12/1967 | Stroud et al. | |
| 3,868,158 A | * | 2/1975 | Laboue | 312/350 |
| 4,126,269 A | * | 11/1978 | Bruges | |
| 4,502,100 A | * | 2/1985 | Greenspan et al. | |
| 4,739,445 A | | 4/1988 | Tragen | |
| 5,210,680 A | * | 5/1993 | Scheibler | |
| 5,247,427 A | * | 9/1993 | Driscoll et al. | 361/695 X |
| 5,287,009 A | | 2/1994 | Heung | |
| 5,927,389 A | * | 7/1999 | Gonsalves et al. | 211/26 X |
| 5,944,201 A | * | 8/1999 | Babboni et al. | 211/151 |
| 6,356,444 B1 | * | 3/2002 | Podoeem | 361/695 X |

\* cited by examiner

*Primary Examiner*—Robert W. Gibson, Jr.
(74) *Attorney, Agent, or Firm*—Michel Sofia; Ogilvy Renault

(57) ABSTRACT

A shelf unit for use in an electronic equipment rack, comprises an electronic equipment structure for holding electronic equipment. An auxiliary equipment structure, such as a fiber management plate, is provided for holding auxiliary equipment. A fan tray is movable in and out of a corresponding tray support structure forming part of the shelf unit. The tray support structure is configured such that when the associated fan tray is pushed in, the fan tray extends in a plane behind the auxiliary equipment structure, but when pulled out the fan tray drops down to clear the auxiliary equipment structure and provide access to the fan in the tray.

22 Claims, 3 Drawing Sheets

COMPACT SHELF UNIT FOR ELECTRONIC EQUIPMENT RACK

BACKGROUND OF THE INVENTION

1. Field of the Invention

The present invention relates to racks for electronic equipment and, more particularly, to a shelf unit for such racks.

2. Description of the Prior Art

It is known to stack electronic equipment in racks. Such racks typically include a plurality of vertically spaced-apart shelf units fitted to a frame. For instance, each shelf unit can include a plurality of printed circuit board assemblies mounted side-by-side with the major planar surface thereof vertically oriented. Each printed circuit board assembly has optical fibers extending therefrom. The optical fibers are bundled together and guided sideways below or above the boards for allowing the same to be removed without having to disturb the fiber bundles.

The shelf units must be cooled to ensure long life and stable operation of the electronic components of the printed circuit board assemblies. This is typically achieved by means of cooling fans. Since the fans require maintenance from time to time, they are generally mounted in the racks below or above the fiber bundles so that the fiber bundles do not have to be moved out of the way to gain access to the fans. This mounting arrangement results in dead spaces behind the fiber bundles and, thus, in less equipment being stacked for a given height of rack.

There is thus a need for a new fan mounting arrangement which would allow more electronic equipment to be stacked in a rack without increasing the height thereof, while still allowing access to the fans without having to disturb the optical fibers extending from the electronic equipment.

SUMMARY OF THE INVENTION

It is therefore an aim of the present invention to provide a compact rack for electronic equipment.

It is also an aim of the present invention to provide a new fan tray and tray arrangement allowing for vertical space savings.

Therefore, in accordance with the present invention, there is provided a shelf unit for use in an electronic equipment rack, comprising an electronic equipment structure for holding electronic equipment, an auxiliary equipment structure associated to said electronic equipment structure for holding auxiliary equipment, said auxiliary equipment structure having a depth substantially smaller than a depth of said electronic equipment structure, and being accessible from a front side of the shelf unit; and a tray movable relative to said electronic and auxiliary equipment structures between a retracted position wherein said tray extends in a plane behind said auxiliary equipment structure and an extended position for providing access to the tray, wherein said tray departs from said plane while being moved between said retracted and extended positions thereof in order to clear said auxiliary support structure.

In accordance with a further general aspect of the present invention, there is provided a shelf unit for use in an electronic equipment rack, comprising an electronic equipment structure for holding electronic equipment, an auxiliary equipment structure for holding auxiliary equipment, a tray movable in and out relative to said equipment structures, and a tray support structure configured such that when said tray is pushed in, the tray extends in a plane behind said auxiliary equipment structure, but when pulled out said tray departs from said plane to clear said auxiliary equipment structure and provide access to said tray.

In accordance with a further general aspect of the present invention, there is provided a shelf unit for use in an electronic equipment rack, comprising an electronic equipment structure for holding electronic equipment, an auxiliary equipment structure for holding auxiliary equipment, a tray movable in and out on a tray support structure, said tray support structure being configured for allowing said tray to be tilted so as to clear said auxiliary equipment structure when the tray is pulled out from a retracted position, wherein said tray extends depth-wise behind said auxiliary equipment structure in the retracted position.

BRIEF DESCRIPTION OF THE DRAWINGS

Having thus generally described the nature of the invention, reference will now be made to the accompanying drawings, showing by way of illustration a preferred embodiment thereof, and in which:

FIG. 4 is a schematic side elevational view in cross-section of the drop down fan tray of FIG. 3 illustrated in its fully extended position just prior to being removed from the rack for servicing purposes or the like.

DESCRIPTION OF THE PREFERRED EMBODIMENTS

Figure 1:
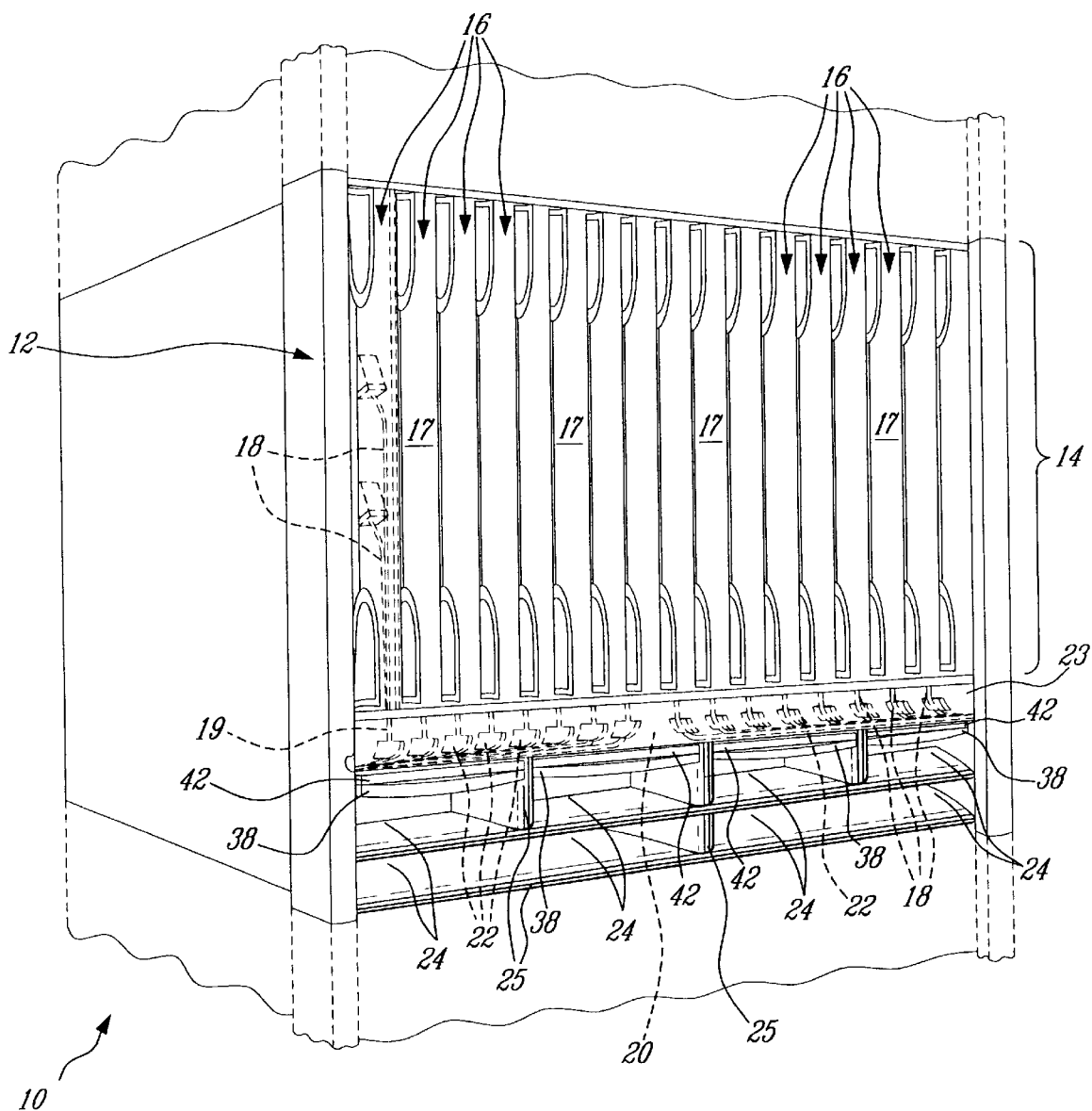
FIG. 1 is a front perspective view illustrating the basic configuration of part of an electronic equipment rack with drop down fan trays/drawers in accordance with a first embodiment of the present invention.
Figure 2:
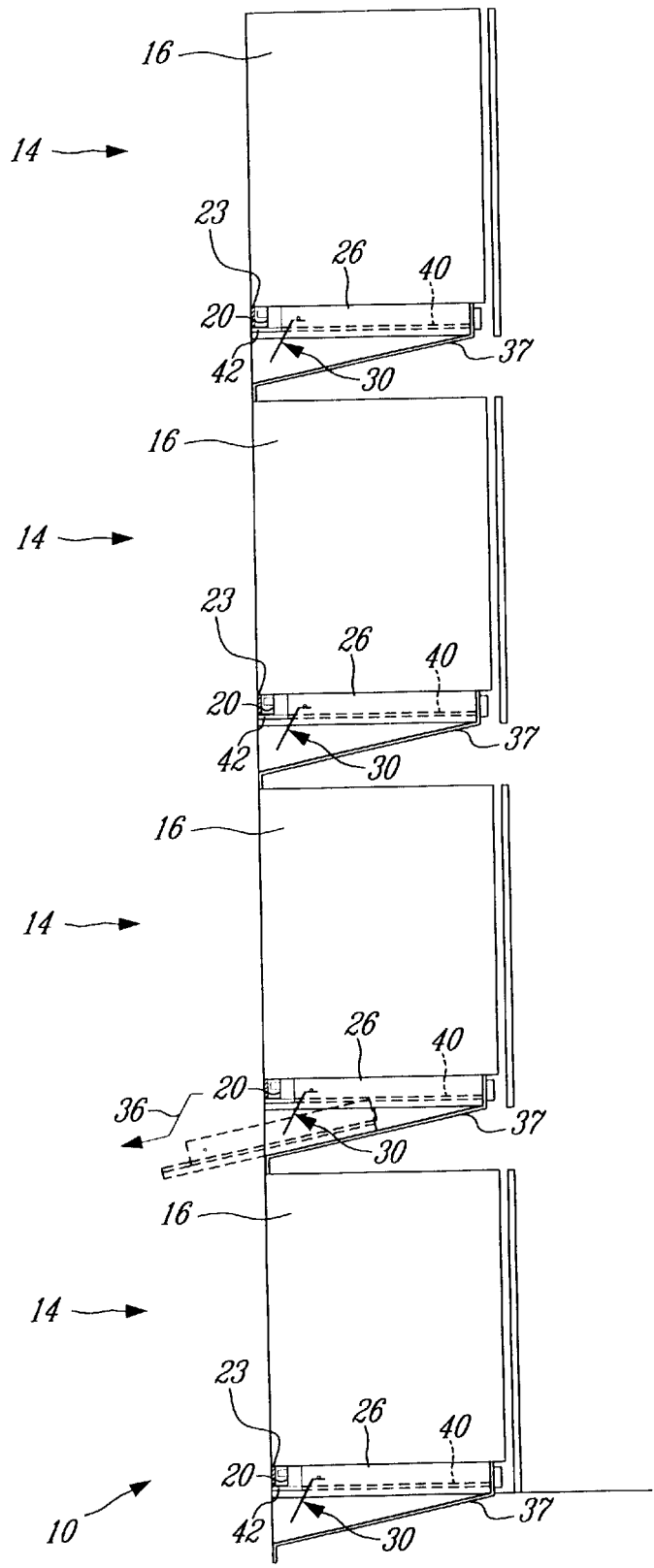
FIG. 2 is a schematic side elevational view of the electronic equipment rack of FIG. 1.

FIGS. 1 and 2 illustrate an electronic equipment rack 10 of the type comprising a frame structure 12 supporting a plurality of vertically spaced-apart cabinets or shelf units 14, only one of which is shown in FIG. 1. Each shelf unit 14 includes a plurality of printed circuit board assemblies 16 mounted side-by-side with the faceplates 17 thereof oriented in a vertical direction. Each printed circuit board assembly 16 has a number of optical fibers 18 (two in the present example) depending downwardly therefrom. A horizontal fiber management plate 20 extends transversely of the rack 10 below each shelf unit 12. The fibers of each group of optical fibers 18 are bundled together in a fiber bundle 19 and redirected sideways to the left-hand side or/and the right-hand side of the rack 10 by means of a horizontal row of laterally spaced-apart arcuate guides 22 projecting forwardly from the fiber management plate 20, as illustrated in FIG. 1. An openable fiber management cover 23 is provided to protect and conceal the optical fibers 18 on the fiber management plate 20. The fiber path from each printed circuit board assembly 16 cannot interfere with other printed circuit board assemblies 16. The fiber bundles 19 cannot be located in front of the printed circuit board assemblies 16 since, if it was the case, the boards 16 could not be pulled out by the front without disturbing the fibers from other printed circuit board assemblies 16. The boards 16 cannot be pulled out from the back because of interfering electronic equipment.

The horizontal fiber bundles 19 therefore have to be located vertically below (or above) the associated shelf unit 14.

Below each fiber management plate 20 is an air intake divided into six distinct ports 24 by an air fender 25 extending horizontally in and transversally of the rack 10. The number of input ports 24 can vary widely (i.e. there can be one or more). A number of side-by-side cooling fans (not shown) are arranged horizontally behind each fiber management plate 20 to draw ambient air from the intake ports 24 upwardly through the overlying shelf unit 14. Each fan has an electric connector 27 projecting rearwardly therefrom for connection with a corresponding socket 29 provided in the frame structure 12 (see FIGS. 3 and 4).

There could be MxN fans in an array of fans. M represents the number of fans across the width direction of a shelf unit 14 and N represents the number of fans in the depth direction of the shelf unit 14.

By locating the horizontal arrays of cooling fans in the free space behind the fiber management plates 20 instead of below these plates, it becomes possible to stack more equipment for a same height of rack. However, the cooling fans must remain accessible for servicing and replacement purposes.

Figure 3:
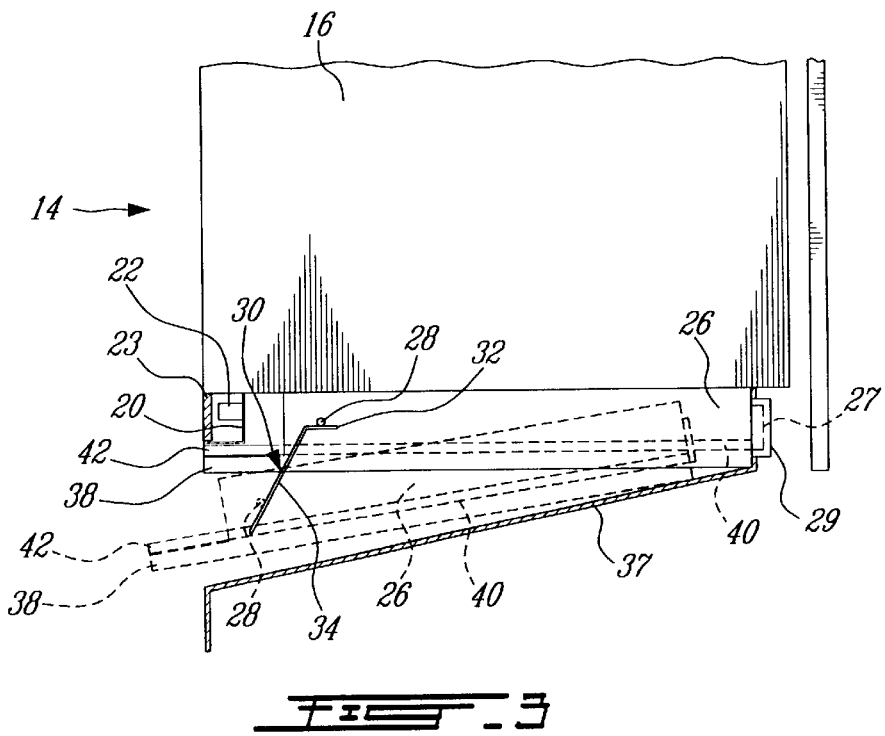
FIG. 3 is a schematic side elevational view in cross-section of a drop down fan tray illustrated in the process of being displaced to an extended position thereof.
Figure 4:
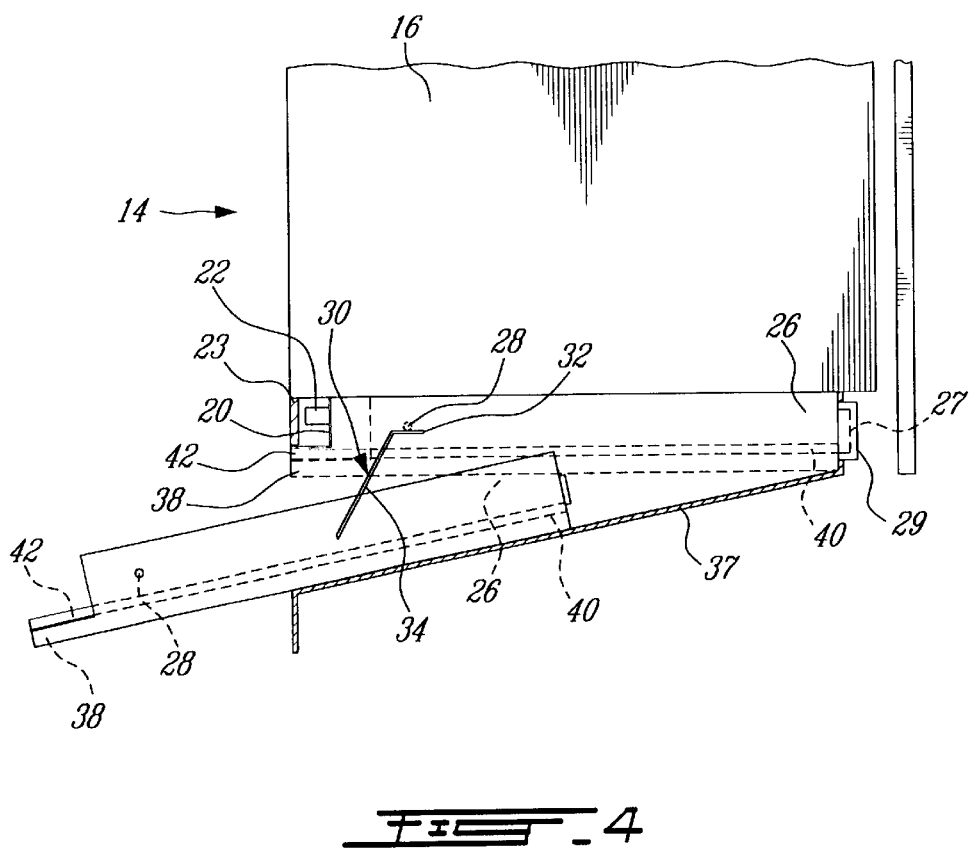

To this end, each MxN fan array is received in a drop down fan tray or a series of fan trays 26. The number of fan trays 26 is equal or smaller than M. As shown in FIGS. 2 to 4, each fan tray 26 is movable in and out of the rack 10 through the top intake ports 24 so that access can be had to the fans for maintenance and, at times, replacement.

Each fan tray 26 is provided at a front end portion thereof with a pair of guide or support elements 28 extending laterally outwardly from opposed sides of the fan tray 26 for riding on corresponding rails 30 fixed to the frame structure 12 on opposed sides of each fan tray 26. Each rail 30 has a horizontal rail section 32 and a downwardly sloping rail section 34 extending forwardly from the horizontal rail section 32. As schematically illustrated by arrow 36 in FIG. 2, the configuration of each pair of rails 30 causes the associated fan tray 26 to be tilted downwardly so as to clear the fiber management plate 20 located there in front when the fan tray 26 is pulled out of the rack 10.

Each fan tray 26 is further supported by an inclined plate 37 sloping downwardly in a forward direction. The incline plate 37 is positioned and configured to provide a support surface upon which the bottom of the tray 26 slides when the support elements 28 thereof disengage from the rails 30 at opposed sides of the tray 26 (see FIG. 4).

Each fan tray 26 is provided with a handle 38 at a front end thereof for allowing the tray to be readily moved in and out of the rack 10. The handles 38 are sized and configured so as to be received in respective ports 24, as illustrated in FIG. 1.

Each fan tray 26 further has a filter receiving section defined by its horizontal wall and side rails for receiving a fan filter 40 which can be slidably moved in and out of the rack 10 independently of the position of its associated tray and through the associated intake port 24. An optional locking mechanism can be provided to releasably lock each fan filter 40 in a retracted position. When the fan trays 26 are retracted in the rack 10 behind the fiber management plates 20, the fan filters 40 extend rearwardly in respective horizontal planes located just below the associated fiber management plates 20. A handle 42 extends forwardly of each fan filter 40 for allowing the same to be readily slid horizontally in and out of the associated fan tray 26, while the latter is still retracted in the frame structure 12, and without disturbing the fibers.

When it is desired to access the contents of one of the fan trays 26, one has just to remove the air fender 25 and grasp the handle 38 of the tray 26 and pull thereon. Optionally, a locking mechanism on the handle of the fan drawer needs to be disactivated. As illustrated in FIGS. 3 to 4, this will first cause the tray 26 to move horizontally forwardly with the support elements 28 thereof riding on the horizontal rail sections 32 and the bottom rear end of the tray 26 supported on the underlying inclined plate 37. As a result, the electric connector 27 of the fan installed in the tray 26 will move out of its associated socket 29. Thereafter, the tray support elements 28 will reach the sloping rail sections 34, thereby causing the front portion of the fan tray 26, including its handle 38, to be tilted downwardly so as to clear the fiber management plate 20, as illustrated in broken lines in FIG. 3. Continuous pulling on the fan tray 26 will cause the tray 26 to drop down on the inclined gliding plate 37 (see FIG. 4), thereby allowing the fan tray 26 to slide out of the frame structure 12 in the plane of the inclined plate 37 through the intake port 24 which is aligned therewith. The fan tray 26 will follow the reverse pattern of movements when subsequently pushed back in place within the frame structure 12, and optionally locked.

As can be appreciated, the above described fan tray arrangement is advantageous in that it provides significant vertical space savings.

The present invention is not limited to be used in the context of optical fibers. The electronic card assemblies could also be connected to electrical cable or wiring for communication or for power. Furthermore, the space below the electronic card assemblies and at the front of the each shelf could also be used for indicators, controls or other equipment related to the vertical electronic cards assemblies. In this case the fiber management plate would be replaced by another appropriate auxiliary equipment support structure.

Furthermore, such auxiliary equipment support structure could be located above or on the side of the electronic equipment support structure (i.e. the structure supporting the electronic card assemblies). It is also understood that the orientation of each shelf unit 14 can be changed and the advantages of the present invention will still be derived. For instance, the printed circuit board (PCB) assemblies 16 could be horizontal and the fan tray could be located on one side of the PCB assemblies behind an auxiliary equipment structure, such as a fiber management plate.

What is claimed is:

1. A shelf unit for use in an electronic equipment rack, comprising an electronic equipment structure for holding electronic equipment, an auxiliary equipment structure associated to said electronic equipment structure for holding auxiliary equipment, said auxiliary equipment structure having a depth substantially smaller than a depth of said electronic equipment structure, and being accessible from a front side of the shelf unit; and a tray movable relative to said electronic and auxiliary equipment structures between a retracted position wherein said tray extends in a plane behind said auxiliary equipment structure and an extended position for providing access to the tray, wherein said tray departs from said plane while being moved between said retracted and extended positions thereof in order to clear said auxiliary support structure.

2. A shelf unit as defined in claim 1, further including a tray support structure, wherein said tray is slidably engageable with said tray support structure for holding said tray in said plane when said tray assumes said retracted position thereof, while causing said tray to be tilted so as to clear said auxiliary equipment structure when the tray is pulled out from said retracted position.

3. A shelf unit as defined in claim 2, wherein said tray support structure includes a pair of rails disposed on opposed sides of said tray for engagement with guide elements extending laterally outwardly from a front half portion of the tray.

4. A shelf unit as defined in claim 3, wherein each of said rails includes a horizontal rail section.

5. A shelf unit as defined in claim 4, wherein each of said rails has a downwardly sloping rail section extending forwardly from said horizontal rail section.

6. A shelf unit as defined in claim 2, wherein support engaging elements extend laterally outwardly from opposed sides of said tray, wherein said tray support structure includes horizontal supports for cooperating with said support engaging elements in holding said tray in a horizontal plane when pushed to said retracted position thereof, and wherein said tray support structure further includes an inclined plate upon which said tray drops down when said support engaging elements move out of engagement from said horizontal supports in response to a pulling action applied on said tray.

7. A shelf unit as defined in claim 1, wherein said tray has a handle accessible from below said auxiliary equipment structure.

8. A shelf unit as defined in claim 7, further including an air intake port below said auxiliary equipment structure, and wherein said handle extends out of said air intake port for allowing said tray to be withdrawn from the shelf unit through said air intake port.

9. A shelf unit as defined in claim 1, wherein said tray has a filter guiding section adapted to slidably receive a fan filter, said filter guiding section extending in a horizontal plane vertically spaced from said auxiliary equipment structure when said tray assumes said retracted position thereof, thereby allowing the fan filter to be moved in and out of the fan filter without having to move said tray to said extended position thereof.

10. A shelf unit as defined in claim 1, wherein said auxiliary equipment structure includes a fiber management plate for redirecting sideways optical fibers extending from the electronic equipment.

11. A shelf unit as defined in claim 1, wherein said tray is adapted to support at least one fan used for cooling the electronic equipment.

12. An electronic equipment rack comprising a shelf unit as defined in claim 1.

13. A shelf unit for use in an electronic equipment rack, comprising an electronic equipment structure for holding electronic equipment, an auxiliary equipment structure for holding auxiliary equipment, a tray movable in and out relative to said electronic and auxiliary equipment structures, and a tray support structure configured such that when said tray is pushed in, the tray extends in a plane behind said auxiliary equipment structure, but when pulled out said tray departs from said plane to clear said auxiliary equipment structure and provide access to said tray.

14. A shelf unit as defined in claim 13, wherein said tray is slidably engageable with said tray support structure for holding said tray in said plane when said tray is pushed in a retracted position thereof.

15. A shelf unit as defined in claim 14, wherein said t ray support structure includes a pair of rails disposed on opposed sides of said tray for engagement with guide elements extending laterally outwardly from a front half portion of the tray.

16. A shelf unit as defined in claim 15, wherein each of said rails includes a horizontal rail section.

17. A shelf unit as defined in claim 16, wherein each of said rails has a downwardly sloping rail section extending forwardly from said horizontal rail section.

18. A shelf unit as defined in claim 13, wherein support engaging elements extend laterally outwardly from opposed sides of said tray, wherein said tray support structure includes horizontal supports for cooperating with said support engaging elements in holding said tray in a horizontal plane when pushed to said retracted position thereof, and wherein said tray support structure further includes an inclined plate upon which said tray drops down when said support engaging elements move out of engagement from said horizontal supports in response to a pulling action applied on said tray.

19. A shelf unit for use in an electronic equipment rack, comprising an electronic equipment structure for holding electronic equipment, an auxiliary equipment structure for holding auxiliary equipment, a tray movable in and out on a tray support structure, said tray support structure being configured for allowing said tray to be tilted so as to clear said auxiliary equipment structure when the tray is pulled out from a retracted position, wherein said tray extends depth-wise behind said auxiliary equipment structure in said retracted position.

20. A shelf unit as defined in claim 19, wherein said t ray support structure includes a pair of rails disposed on opposed sides of said tray for engagement with guide elements extending laterally outwardly from the tray.

21. An shelf unit as defined in claim 20, wherein each of said rails includes a horizontal rail section and a downwardly sloping rail section extending forwardly from said horizontal rail section.

22. A shelf unit as defined in claim 19, wherein support engaging elements extend laterally outwardly from opposed sides of said tray, wherein said tray support structure includes horizontal supports for cooperating with said support engaging elements in holding said tray in a horizontal plane when pushed to said retracted position thereof, and wherein said tray support structure further includes an inclined plate upon which said tray drops down when said support engaging elements move out of engagement from said horizontal supports in response to a pulling action applied on said tray.

* * * * *